(12) United States Patent
Do

(10) Patent No.: US 7,852,129 B2
(45) Date of Patent: Dec. 14, 2010

(54) POWER UP SIGNAL GENERATION CIRCUIT AND METHOD FOR GENERATING POWER UP SIGNAL

(75) Inventor: Chang-Ho Do, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/266,660

(22) Filed: Nov. 7, 2008

(65) Prior Publication Data
US 2009/0302902 A1 Dec. 10, 2009

(30) Foreign Application Priority Data
Jun. 4, 2008 (KR) ...................... 10-2008-0052733

(51) Int. Cl.
H03L 7/00 (2006.01)
(52) U.S. Cl. .................. 327/143; 327/142; 327/198
(58) Field of Classification Search ................ 327/142, 327/143, 198
See application file for complete search history.

(56) References Cited

U.S. PATENT DOCUMENTS

| | | | | |
|---|---|---|---|---|
| 5,602,502 | A * | 2/1997 | Jiang | 327/143 |
| 5,767,710 | A * | 6/1998 | Cho | 327/143 |
| 5,831,460 | A * | 11/1998 | Zhou | 327/143 |
| 6,097,659 | A * | 8/2000 | Kang | 365/226 |
| 6,118,315 | A * | 9/2000 | Guedj | 327/143 |
| 6,201,751 | B1 * | 3/2001 | Thomann | 365/226 |
| 6,744,295 | B2 * | 6/2004 | Miyagi | 327/217 |
| 6,885,605 | B2 * | 4/2005 | Lee et al. | 365/226 |
| 6,897,689 | B2 * | 5/2005 | La Rosa | 327/143 |
| 6,937,074 | B2 * | 8/2005 | Shin | 327/143 |
| 7,106,112 | B2 * | 9/2006 | Jang | 327/143 |
| 7,276,941 | B2 * | 10/2007 | Jang | 327/143 |
| 7,295,050 | B2 * | 11/2007 | Shin et al. | 327/143 |

(Continued)

FOREIGN PATENT DOCUMENTS

JP 2003-203479 7/2003

(Continued)

OTHER PUBLICATIONS

Notice of Allowance issued from Korean Intellectual Property Office on Jan. 7, 2010.

*Primary Examiner*—Lincoln Donovan
*Assistant Examiner*—Adam D Houston
(74) *Attorney, Agent, or Firm*—IP & T Group LLP

(57) ABSTRACT

A power up signal generation circuit transits a power up signal at a predetermined target voltage level by providing a predetermined hysteresis characteristic to the target voltage level of a power supply voltage corresponding to the power up signal. The power up signal generation circuit includes a first voltage detection unit that detects a first target voltage level of a power supply voltage to output a detection signal. The circuit also includes a second voltage detection unit that detects a second target voltage level of the power supply voltage in response to a power up signal to output a control signal, wherein the second target voltage level is lower than the first target voltage level. A power up signal drive unit of the circuit activates the power up signal in response to the detection signal and drives the power up signal in response to the control signal.

29 Claims, 4 Drawing Sheets

U.S. PATENT DOCUMENTS

| | | | |
|---|---|---|---|
| 7,417,475 B2 * | 8/2008 | Byeon et al. | 327/143 |
| 7,417,476 B1 * | 8/2008 | Hung | 327/143 |
| 7,425,854 B2 * | 9/2008 | Suzuki | 327/198 |
| 7,436,226 B2 * | 10/2008 | Kim | 327/143 |
| 7,545,186 B2 * | 6/2009 | Suzuki et al. | 327/143 |
| 2001/0022746 A1 * | 9/2001 | Kim et al. | 365/200 |
| 2003/0020525 A1 * | 1/2003 | Shigemasa et al. | 327/143 |
| 2004/0070430 A1 * | 4/2004 | La Rosa | 327/143 |
| 2005/0135174 A1 * | 6/2005 | Lee et al. | 365/226 |
| 2009/0121754 A1 * | 5/2009 | Garcia et al. | 327/143 |

FOREIGN PATENT DOCUMENTS

| | | | |
|---|---|---|---|
| JP | 2006005459 A | * | 1/2006 |
| KR | 1019970051265 A | | 7/1997 |
| KR | 1020030034462 A | | 5/2003 |

* cited by examiner

US 7,852,129 B2

POWER UP SIGNAL GENERATION CIRCUIT AND METHOD FOR GENERATING POWER UP SIGNAL

CROSS-REFERENCE TO RELATED APPLICATION

The present invention claims priority of Korean patent application number 10-2008-0052733, filed on Jun. 4, 2008, which is incorporated by reference in its entirety.

BACKGROUND OF THE INVENTION

The present invention relates to a semiconductor design technology, and more particularly to a power up signal generation circuit and a method for generating a power up signal.

In general, semiconductor devices such as a double data rate synchronous DRAM (DDR SDRAM) include a power up signal generation circuit for ensuring a stable operation of an internal circuit. The power up signal generation circuit determines whether an external power supply voltage applied from the outside has a sufficient voltage level for a stable operation of an internal circuit to output it as a power up signal.

The semiconductor devices include various internal circuits for performing a variety of operations. The various internal circuits include PMOS transistors and NMOS transistors, particularly, PMOS transistors and NMOS transistors for receiving an internal power supply voltage as a bias voltage. The internal power supply voltage is generated by dividing or boosting the external power supply voltage, and thus has a voltage level corresponding to the external power supply voltage. Accordingly, if the PMOS transistors and the NMOS transistors, which receive the internal power supply voltage as a bias voltage, are operated while the external power supply voltage still has insufficient voltage level, problems such as latch up may be caused, which may be a cause of severe damages to a semiconductor device. To prevent such problems, the semiconductor device utilizes the power up signal.

In general, the power up signal maintains a ground voltage until the external power supply voltage is increased to a target voltage level, and is transited to the external power supply voltage when the external power supply voltage has a target voltage level. While the power up signal maintains the ground voltage, the semiconductor device performs an initialization and a stabilization.

The target voltage level depends on a design, and is recently being designed to have a hysteresis characteristic. That is, the target voltage level is designed to secure stable operations of the internal circuits in a period where the external power supply voltage is increased to power on the semiconductor device. The target voltage level is also designed to prevent the reset of the power up signal due to a voltage drop of the external power supply voltage caused by a power consumption or a power noise in a period where the external power supply voltage is decreased to power off the semiconductor device. In other words, the target voltage is designed differently in a rising period of the external power supply voltage and in a falling period of the external power supply voltage.

FIG. 1 is a circuit diagram of a conventional power up signal generation circuit.

Referring to FIG. 1, the power up signal generation circuit includes a voltage division unit 110, a voltage detection unit 130 and a power up signal drive unit 150.

The voltage division unit 110 is configured to divide the external power supply voltage to generate a divided voltage V_DIV. To do this, the voltage division unit 110 includes a first resistor R11 and a second resistor R12, which are serially connected between an external power supply voltage terminal VDD and a ground voltage terminal VSS. The divided voltage V_DIV varies linearly with the external power supply voltage.

The voltage detection unit 130 is configured to receive the divided voltage V_DIV to output a target voltage level as a voltage detection signal V_DET. To do this, the voltage detection unit 130 includes a third resistor R13 and a first NMOS transistor NM11 which are serially connected between the external power supply voltage terminal VDD and the ground voltage terminal VSS. The voltage level of the voltage detection signal V_DET is an important factor in determining the time when a power up signal PWRUP is transited to the external power supply voltage.

The power up signal drive unit 150 includes an inverter INV11 and a second NMOS transistor NM12 to generate the power up signal PWRUP in response to a voltage detection signal V_DET. The inverter INV11 buffers the voltage detection signal V_DET to output the power up signal PWRUP, and the second NMOS transistor NM12 drives an input terminal of the inverter INV1 in response to the power up signal PWRUP. Here, the second NMOS transistor NM12 allows the power up signal has a different target voltage level in the falling period of the external power supply voltage from that in the rising period of the external power supply voltage. This will be described in detail below.

FIG. 2 is an operation-timing diagram illustrating voltage levels of the external power supply voltage terminal VDD and the power up signal PWRUP of FIG. 1. In FIG. 2, the horizontal axis represents a time, and the vertical axis represents a corresponding voltage. For convenience of explanation, the target voltage level in the rising period of the external power supply voltage is referred to as a 'first target voltage level' and represented by a reference numeral 'V1'. In addition, the target voltage level in the falling period of the external power supply voltage is referred to as a 'second target voltage level' and represented by a reference numeral 'V2'.

Referring to FIGS. 1 and 2, in a period before t1, the external power supply voltage is increased gradually, which is applied to power on the semiconductor device. However, because the first NMOS transistor NM11 is still turned off, the voltage detection signal V_DET has a voltage level corresponding to the external power supply voltage. Hence, the power up signal PWRUP maintains the voltage level of the ground voltage terminal VSS.

In a period from t1 to t2, the external power supply voltage continues to be increased gradually, so that the drive current of the first NMOS transistor NM11 is also increased gradually. As the external power supply voltage reaches the first target voltage level V1, the first NMOS transistor NM11 is turned on so that the voltage detection signal V_DET has the voltage level of the ground voltage terminal VSS. As a result, the power up signal PWRUP is transited to the external power supply voltage in response to the voltage detection signal V_DET. Here, the second NMOS transistor NM12 is turned on in response to the power up signal PWRUP.

In a period from t2 to t3, the external power supply voltage maintains a sufficient voltage level, and thus the power up signal PWRUP also maintains a voltage level proportional to the external power supply voltage. Here, the external power supply voltage may experience a voltage drop due to power consumption or power noise. If the external power supply voltage is dropped below the first target voltage level V1, the first NMOS transistor NM11 may be turned off. However, as the second NMOS transistor NM12 still maintains the turn on state by receiving the fed back power up signal PWRUP, the power up signal PWRUP is not transited to the voltage level of the ground voltage terminal VSS. That is, the power up signal PWRUP is not reset.

In a period from t3 to t4, the external power supply voltage is decreased to power down the semiconductor device. When the external power supply voltage is higher than the second target voltage level V2, although the first NMOS transistor NM11 is turned off, the power up signal PWRUP is not reset because the second NMOS transistor NM12 still maintains the turn on state, as described above. Afterwards, as the external power supply voltage is decreased below the second target voltage level V2, the second NMOS transistor NM12 is turned off, and thus, the power up signal PWRUP is transited to the voltage level of the ground voltage terminal VSS.

In summary, the first target voltage level V1 in the rising period of the external power voltage is determined by the ratio of the resistance of the third resistor R13 to the turn on resistance of the first NMOS transistor NM11. On the contrary, the second target voltage level V2 in the falling period of the external power supply voltage is determined, as the first NMOS transistor NM11 is turned off, by the ratio of the resistance of the third resistor R13 to the turn on resistance of the second NMOS transistor NM12.

That is, the second target voltage level V2 is determined by the design of the third resistor R13 and the second NMOS transistor NM12. However, in the conventional power up signal generation circuit, the second target voltage level V2 is variable for the following reasons.

The conventional power up signal generation circuit determines the second target voltage level V2 depending on the second NMOS transistor NM12. That is, the conventional power up signal generation circuit has a feedback configuration where the power up signal PWRUP is generated according to the voltage detection signal V_DET, the second NMOS transistor NM12 is controlled by the power up signal PWRUP, and the voltage level of the voltage detection signal V_DET is determined by the second NMOS transistor NM12 and the third resistor R13. Therefore, the second target voltage level V2 depends on the design of the second NMOS transistor NM12.

However, the properties of the second NMOS transistor NM12 are varied with conditions of a process, a voltage, and a temperature. Hence, the second target voltage level V2 is also varied with the conditions of the process, the voltage, and the temperature. The second voltage level V2 varying differently from the predetermined voltage level may enlarge the variation of the power up signal PWRUP.

Hereinafter, the effect of the enlarged variation of the power up signal PWRUP will be described.

Referring back to FIG. 2, in a period A where the second target voltage level V2 is higher than the predetermined voltage level (a voltage level at t4), the power up signal PWRUP may be reset unexpectedly by a voltage drop of the external power supply voltage, which is caused by a power consumption or a power noise.

In a period B where the second target voltage level V2 is lower than the predetermined voltage level, if the semiconductor device is powered on quickly after being powered off, the power up signal PWRUP may maintain the external power supply voltage without the reset period where the power up signal PWRUP has the voltage level of the ground voltage terminal VSS. That is, although the external power supply voltage is lowered below the predetermined voltage level by the power off operation, the power up signal PWRUP is not reset, and before being transited to the voltage level of the ground voltage terminal VSS, the power up signal PWRUP is raised again according to the external power supply voltage by the power on operation. This may result in that the internal circuit cannot detect the power off operation and thus the semiconductor device cannot perform the initialization. This may cause malfunctions of the semiconductor device.

SUMMARY OF THE INVENTION

Embodiments of the present invention are directed to providing a power up signal generation circuit for transiting a power up signal at a predetermined target voltage level by providing a predetermined hysteresis characteristic to the target voltage level of a power supply voltage corresponding to the power up signal.

In accordance with an embodiment of the invention, there is provided a power up signal generation circuit, which includes a first voltage detection unit configured to detect a first target voltage level of a power supply voltage to output a detection signal, a second voltage detection unit configured to detect a second target voltage level of the power supply voltage in response to a power up signal to output a control signal, wherein the second target voltage level is lower than the first target voltage level, and the first and second target voltage levels are greater than a ground voltage level, and a power up signal drive unit configured to activate the power up signal in response to the detection signal and drive the power up signal in response to the control signal.

In accordance with another embodiment of the invention, there is provided a power up signal generation circuit, which includes a voltage division unit configured to divide a power supply voltage, a first voltage detection unit configured to detect a first target voltage level using an output voltage of the voltage division unit to output a detection signal, a second voltage detection unit configured to detect the second target voltage level using the output voltage of the voltage division unit in response to the power up signal to output a control signal, wherein the second target voltage level is lower than the first target voltage level, and the first and second target voltage levels are greater than a ground voltage level, and a power up signal drive unit configured to activate the power up signal in response to the detection signal and drive the power up signal in response to the control signal.

In accordance with further embodiment of the invention, there is provided a method for generating a power up signal, which includes detecting a first target voltage level according to a rising period of a power supply voltage and a second target voltage level according to a falling period of the power supply voltage, activating a power up signal in response to a first detection signal corresponding to the first target voltage level, driving the activated power up signal in response to the first detection signals and a second detection signal corresponding to the second target voltage level, and deactivating the power up signal in response to the second detection signal.

The typical power up signal has a great variation in a transition time according to a process, a voltage, and a temperature, and thus may be reset unexpectedly or may not be reset at unexpected time. On the contrary, the power up signal generation circuit in accordance with the embodiments of the invention can decrease such possibilities by transiting the power up signal at the predetermined first and second target voltage levels. Particularly, by using a control signal generated according to the external power supply voltage level in determining the second target voltage level, it is possible to transit the power up signal at the desired second target voltage level.

DESCRIPTION OF SPECIFIC EMBODIMENTS

Hereinafter, a circuit and a method for generating a power up signal in accordance with the present invention will be described in detail with reference to the accompanying drawings.

Figure 1:
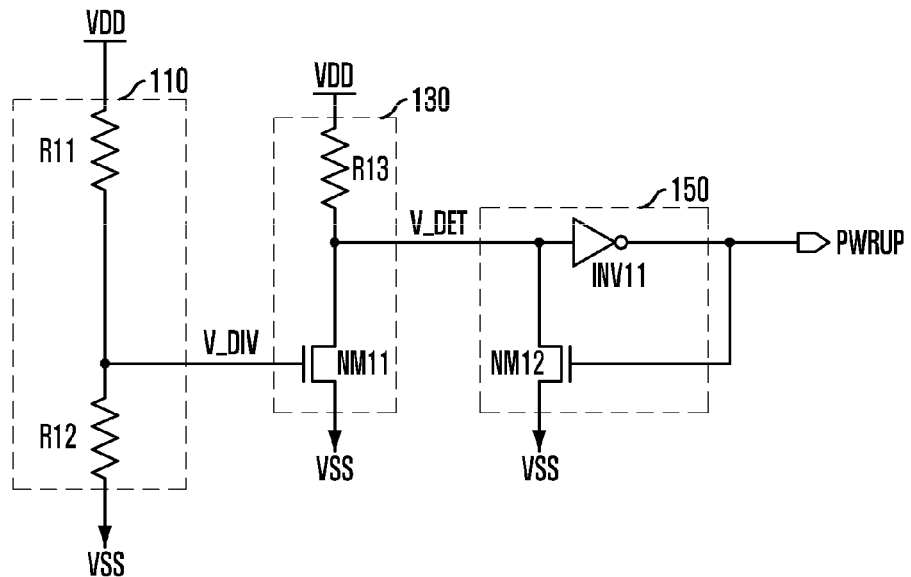
FIG. 1 is a circuit diagram of a conventional power up signal generation circuit.
Figure 2:
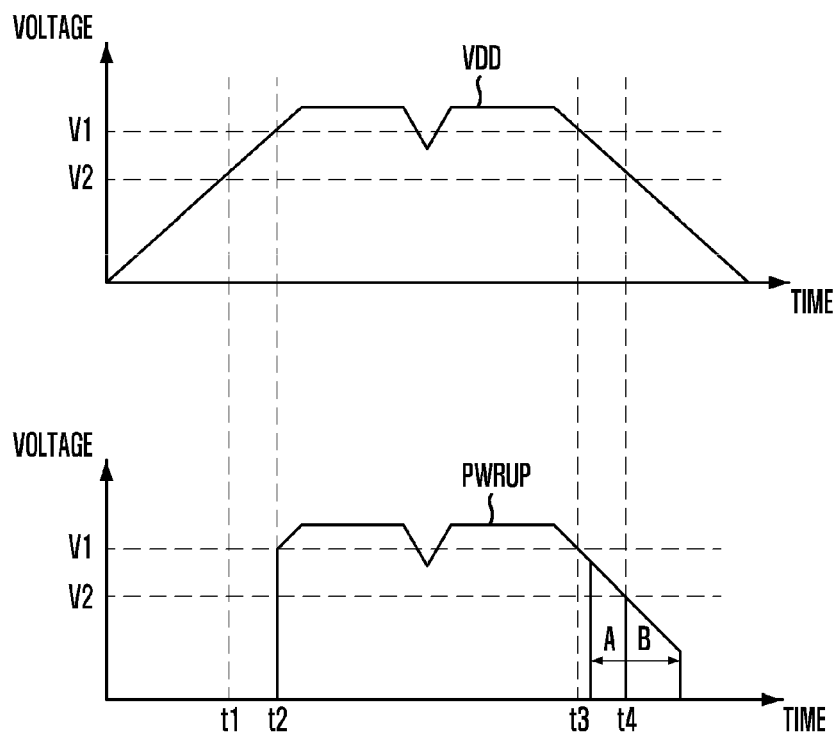
FIG. 2 is an operation-timing diagram illustrating voltage levels of an external power supply voltage terminal (VDD) and a power up signal (PWRUP) of FIG. 1.
Figure 3:
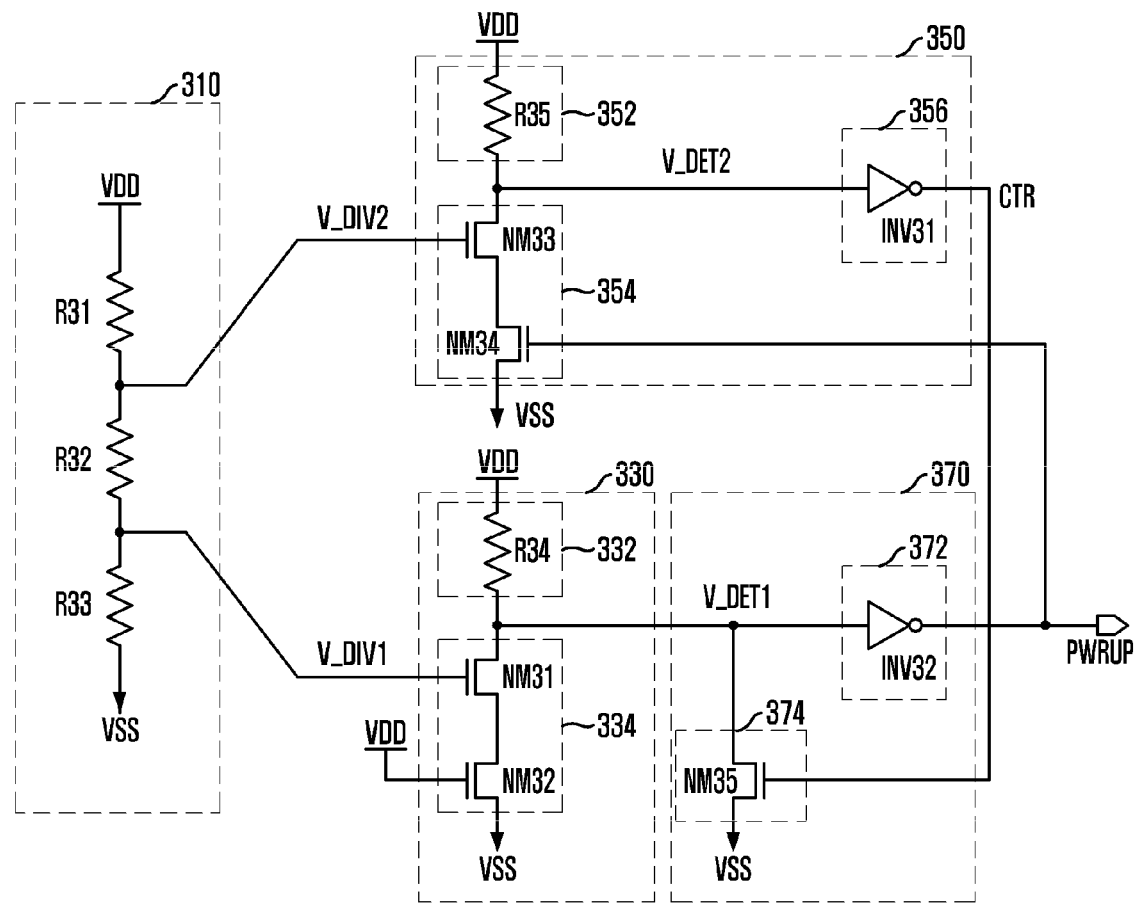
FIG. 3 is a circuit diagram of a power up signal generation circuit in accordance with an embodiment of the present invention.

FIG. 3 is a circuit diagram of a power up signal generation circuit in accordance with an embodiment of the invention.

Referring to FIG. 3, the power up signal generation circuit may include a voltage division unit 310, a first voltage detection unit 330, a second voltage detection unit 350, and a power up signal drive unit 370.

The voltage division unit 310 is configured to divide an external power supply voltage to generate a first divided voltage V_DIV1 and a second divided voltage V_DIV2. The voltage division unit 310 may include first to third resistors R31, R32 and R33 which are serially connected between an external power supply voltage terminal VDD and a ground voltage terminal VSS. Here, the first and second divided voltages V_DIV1 and V_DIV2 vary linearly with the external power supply voltage. The first divided voltage V_DIV1 may have a voltage level lower than that of the second divided voltage V_DIV2.

The first voltage detection unit 330 is configured to receive the first divided voltage V_DIV1 from the voltage division unit 310 to detect a first target voltage level. The first voltage detection unit 330 includes a first load 332 and a first driver 334.

The first load 332 includes a fourth resistor R34 connected between the external power supply voltage terminal VDD and an output terminal of a first voltage detection signal V_DET1. The first driver 334 includes a first NMOS transistor NM31 and a second NMOS transistor NM32 which are serially connected between the output terminal of the first voltage detection signal V_DET1 and the ground voltage terminal VSS. Here, the first NMOS transistor NM31 forms a current path between the output terminal of the first voltage detection signal V_DET1 and the second NMOS transistor NM32 in response to the first divided voltage V_DIV1. Also, the second NMOS transistor NM32 forms a current path between the first NMOS transistor NM31 and the ground voltage terminal VSS in response to the external power supply voltage VDD.

The first driver 334 may pull-down drive the output terminal of the first voltage detection signal V_DET1 in response to the first divided voltage V_DIV1. Hence, the first voltage detection signal V_DET1 may have the voltage level of the ground voltage terminal VSS in response to the first divided voltage V_DIV1 at the first target voltage level.

The second voltage detection unit 350 is configured to receive the second divided voltage V_DIV2 from the voltage division unit 310 to detect a second target voltage level in response to the power up signal PWRUP. The second voltage detection unit 350 includes a detector and a buffer 356. Here, the power up signal PWRUP may determine the operation time of the second voltage detection unit 350.

The detector includes a second load 352 and a second driver 354 to receive the second divided voltage V_DIV2 to detect the second target voltage level. The second load 352 includes a fifth resistor R35 connected between the external power supply voltage terminal VDD and the output terminal of the second voltage detection signal V_DET2. The second driver 354 includes a third NMOS transistor NM33 and a fourth NMOS transistor NM34 which are serially connected between the output terminal of the second voltage detection signal V_DET2 and the ground voltage terminal VSS. Here, the third NMOS transistor NM33 is an input unit for the second divided voltage V_DIV2, and forms a current path between the output terminal of the second voltage detection signal V_DET2 and the fourth NMOS transistor NM34 in response to the second divided voltage V_DIV2. The fourth NMOS transistor NM34 is an activation unit for enabling the third NMOS transistor NM33 in response to the power up signal PWRUP, and forms a current path between the third NMOS transistor NM33 and the ground voltage terminal VSS in response to the power up signal PWRUP.

The second driver 354 is enabled by the power up signal PWRUP to pull-down drive the output terminal of the second voltage detection signal V_DET2 in response to the second divided voltage V_DIV2. Accordingly, the second voltage detection signal V_DET2 may have the voltage level of the ground voltage terminal VSS in response to the second divided voltage V_DIV2 at the second target voltage level.

The buffer 356 is configured to buffer the second voltage detection signal V_DET2 to generate a control signal CTR. The buffer 356 includes a first inverter INV31 configured to invert the second voltage detection signal V_DET2 to output the control signal CTR. Here, the control signal CTR may be used to control the turn on/off operation of a fifth NMOS transistor NM35, which will be described below.

The power up signal PWRUP may have a voltage level determined by the control signal CTR after being transited to the external power supply voltage at the first target voltage level. That is, after the power up signal PWRUP is transited to the external power supply voltage at the first target voltage level, the control signal CTR may serve to allow the power up signal to maintain the external power supply voltage or to be transited to the voltage level of the ground voltage terminal at the second target voltage level.

The power up signal drive unit 370 is configured to activate the power up signal according to the first voltage detection signal V_DET1, and then drive the power up signal according to the control signal CTR. The power up signal drive unit 370 includes an output buffer 372 and a controller 374.

The output buffer 372 is configured to buffer the first voltage detection signal V_DET1 to output the power up signal PWRUP. The output buffer 372 includes a second inverter INV32 configured to invert the first voltage detection signal V_DET1.

The controller 374 is configured to control the deactivation time of the power up signal PWRUP in response to the control signal CTR. The controller 374 include a fifth NMOS transistor NM35 configured to form a current path between an input terminal of the output buffer 372 and the ground voltage terminal VSS in response to the control signal CTR.

According to the embodiment, after the power up signal is transited at the first target voltage level, the controller 374 allows the input terminal of the output buffer 372 to maintain a predetermined voltage level so that the power up signal PWRUP maintains the external power supply voltage before the second target voltage level. That is, as the control signal CTR has a logic low level, the fifth NMOS transistor NM35 is turned on so that the input terminal of the output buffer 372 maintains the voltage level of the ground voltage terminal VSS. Then, until the external power supply voltage is lowered to the second target voltage level, the first voltage detection signal V_DET1 is prevented from being deactivated by the control signal CTR, and thus the power up signal PWRUP is not reset. In addition, the controller 374 may allow the power up signal PWRUP to be transited to the voltage level of the ground voltage terminal VSS at the second target voltage level. That is, as the control signal has a logic low level, the fifth NMOS transistor NM35 is turned off so that the power up signal PWRUP is transited to the voltage level of the ground voltage terminal VSS.

Resultantly, after being transited to the external power supply voltage at the first target voltage level, the power up signal PWRUP is kept at the external power supply voltage by the control signal CTR until the external power supply voltage is lowered to the second target voltage level. Afterwards, as the external power supply voltage is lowered below the second target voltage level, the power up signal PWRUP is transited to the voltage level of the ground voltage terminal VSS by the control signal CTR.

Figure 4:
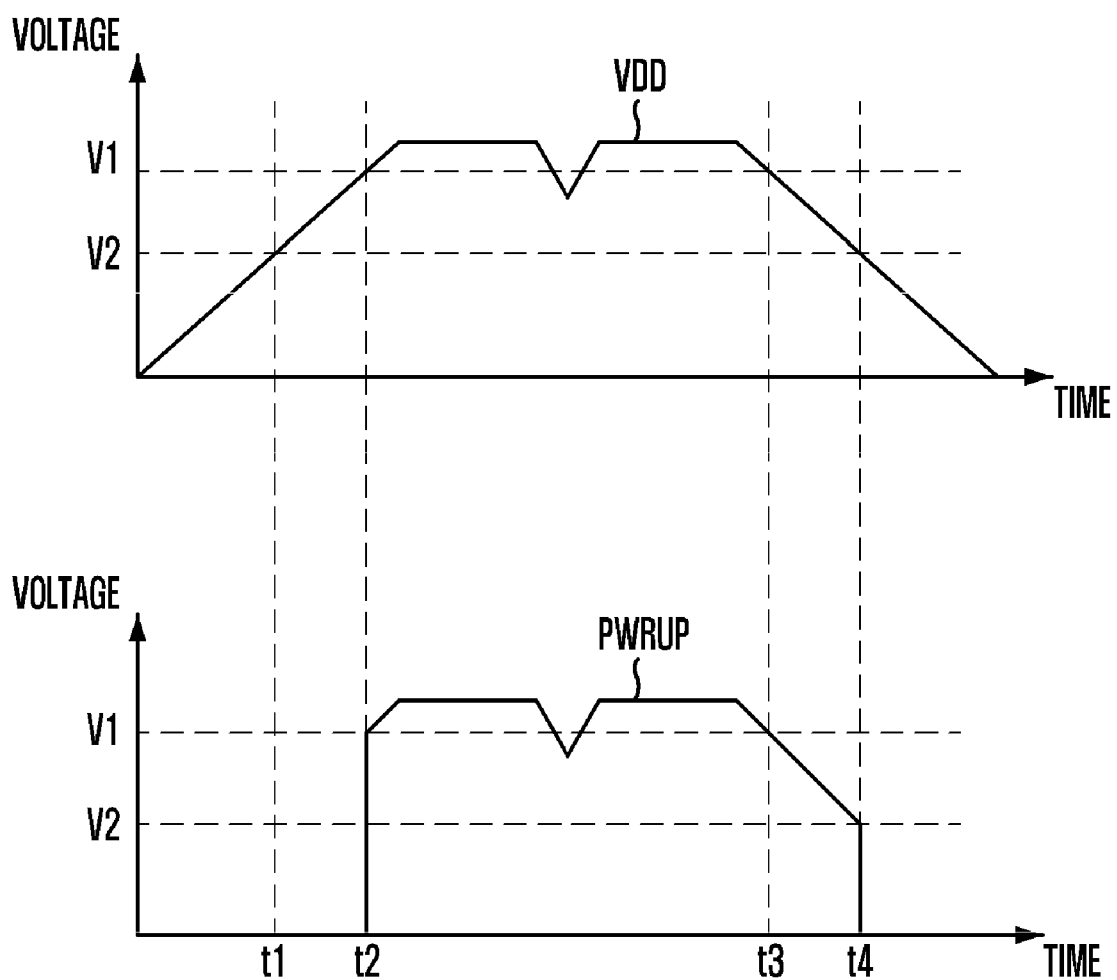
FIG. 4 is an operation-timing diagram illustrating voltage levels of an external power supply voltage terminal (VDD) and a power up signal (PWRUP) of FIG. 3.

FIG. 4 is an operation-timing diagram illustrating the voltage levels of the external power supply voltage terminal VDD and the power up signal PWRUP of FIG. 3. In FIG. 4, the horizontal axis represents a time and the vertical axis represents a voltage. For convenience of explanation, the first target voltage level is represented by the reference numeral V1 and the second target voltage level is represented by the reference numeral V2.

Referring to FIGS. 3 and 4, before t1, the external power supply voltage is gradually increased, which is applied to power on the semiconductor device. Here, the voltage division unit 310 divides the external power supply voltage to generate the first and second divided voltages V_DIV1 and V_DIV2. Then, since the second divided voltage V_DIV2 has higher voltage level than the first divided voltage V_DIV1, the third MOS transistor NM33 is turned on prior to the first NMOS transistor NM31. The power up signal PWRUP is kept at the voltage level of the ground voltage terminal VSS by the first voltage detection signal V_DET1 corresponding to the external power supply voltage. Accordingly, although the third NMOS transistor NM33 is turned on prior to the first NMOS transistor NM31, the second voltage detection signal V_DET2 is not activated because the fourth NMOS transistor NM34 is turned off.

In a period from t1 to t2, the external power supply voltage continues to be increased, and thus the drive current of the first NMOS transistor NM31 is also increased gradually. When the external power supply voltage reaches the first target voltage level V1, the first NMOS transistor NM11 is turned on so that the first voltage detection signal V_DET1 has the voltage level of the ground voltage terminal VSS. Then, the power up signal PWRUP is transited to the external power supply voltage in response to the first voltage detection signal V_DET1. Thereupon, the fourth NMOS transistor NM34 is turned on in response to the power up signal PWRUP, so that the second voltage detection signal V_DET2 is activated with the voltage level of the ground voltage terminal VSS. Thereafter, the fifth NMOS transistor NM35 is turned on in response to the control signal CTR, so that the first voltage detection signal V_DET1 has the voltage level of the ground voltage terminal VSS.

In a period from t2 to t3, the external power supply voltage maintains a sufficient voltage level, and the power up signal PWRUP also maintains a voltage level corresponding to the external power supply voltage. Although the external power supply voltage experiences a voltage drop due to power consumption or power noise, the power up signal PWRUP is not reset because the fifth NMOS transistor NM35 is turned on by the control signal CTR.

The conventional power up signal generation circuit has a feedback configuration, and thus the second target voltage level V2 is determined by the NMOS transistor enabled by the power up signal PWRUP. Since the operation characteristics of MOS transistors generally vary with condition of a process, a voltage and a temperature, the variation of the second target voltage level V2 is great in the conventional power up signal generation circuit. On the contrary, in the power up signal generation circuit in accordance with the embodiment, the second target voltage level V2 is determined using the control signal CTR which controls the turn on/off of the fifth NMOS transistor NM35. Accordingly, the second target voltage level can be fixed to a predetermined voltage level. This means that the power up signal PWRUP is always transited corresponding to the second target voltage level V2 in the falling period of the external power supply voltage.

In a period from t3 to t4, the external power supply voltage is decreased to power down the semiconductor device. When the external power supply voltage is higher than the second target voltage level V2, although the first NMOS transistor NM31 is turned off, the first voltage detection signal V_DET1 can be prevented from being deactivated because the fifth NMOS transistor NM35 is turned on by the control signal CTR. That is, the power up signal PWRUP may maintain the level of the external power supply voltage without being reset.

Thereafter, as the external power supply voltage is lowered to the second target voltage level V2, the third NMOS transistor NM33 is turned off and the fifth NMOS transistor NM35 is also turned off in response to the control signal CTR. Accordingly, the power up signal PWRUP is transited to the voltage level of the ground voltage terminal VSS. That is, the power up signal PWRUP is reset.

In summary, in the rising period of the external power supply voltage, the first target voltage level V1 can be determined by the ratio of the load value of the first load 332 to the load value of the first driver 334 when the first driver 334 is enabled. Also, in the falling period of the external power supply voltage, the second target voltage level V2 can be determined by the ratio of the load value of the second load 352 to the load value of the second driver 354 when the second driver 354 is enabled.

The transition of the power up signal PWRUP corresponding to the first target voltage level V1 may be determined by the turning on of the first NMOS transistor NM31. Thereafter, the power up signal PWRUP can maintain the external power supply voltage in response to the control signal CTR. The reset of the power up signal PWRUP corresponding to the second target voltage level V2 may be determined by the turning off of the fifth NMOS transistor NM35 which is enabled by the control signal CTR. Here, after the first target voltage level V1, the control signal CTR comes to have a logic low level by the turning off of the third NMOS transistor NM33. Accordingly, it can be mentioned that the reset of the power up signal PWRUP corresponding to the second target voltage level V2 is determined by the turning off of the third NMOS transistor NM33 which is operated according to the external power supply voltage.

According to the embodiment, the power up signal PWRUP may be activated by the first voltage detection signal V_DET1 at the first target voltage level, maintain the external power supply voltage in response to the control signal CTR corresponding to the external power supply voltage, and be transited to the voltage level of the ground voltage terminal VSS at the second target voltage level.

The power up signal generation circuit in accordance with the embodiment may generate the first and second divided voltages V_DIV1 and V_DIV2, and transit the power up signal PWRUP according to the first and second target voltage levels V1 and V2, which correspond thereto. Accordingly, the difference between the first target voltage level V1 and the second target voltage level V2 may be determined by the second resistor R32. To this end, the first load 332 and the second load 352 are preferably designed to have the same physical configuration, and the first driver 334 and the second driver 354 are preferably designed to have the same physical configuration. Here, the same physical configuration refers to the configuration having the same load value for passive devices, and to the configuration having the same channel width and length and thus having the same effective load value for active devices.

Figure 5:
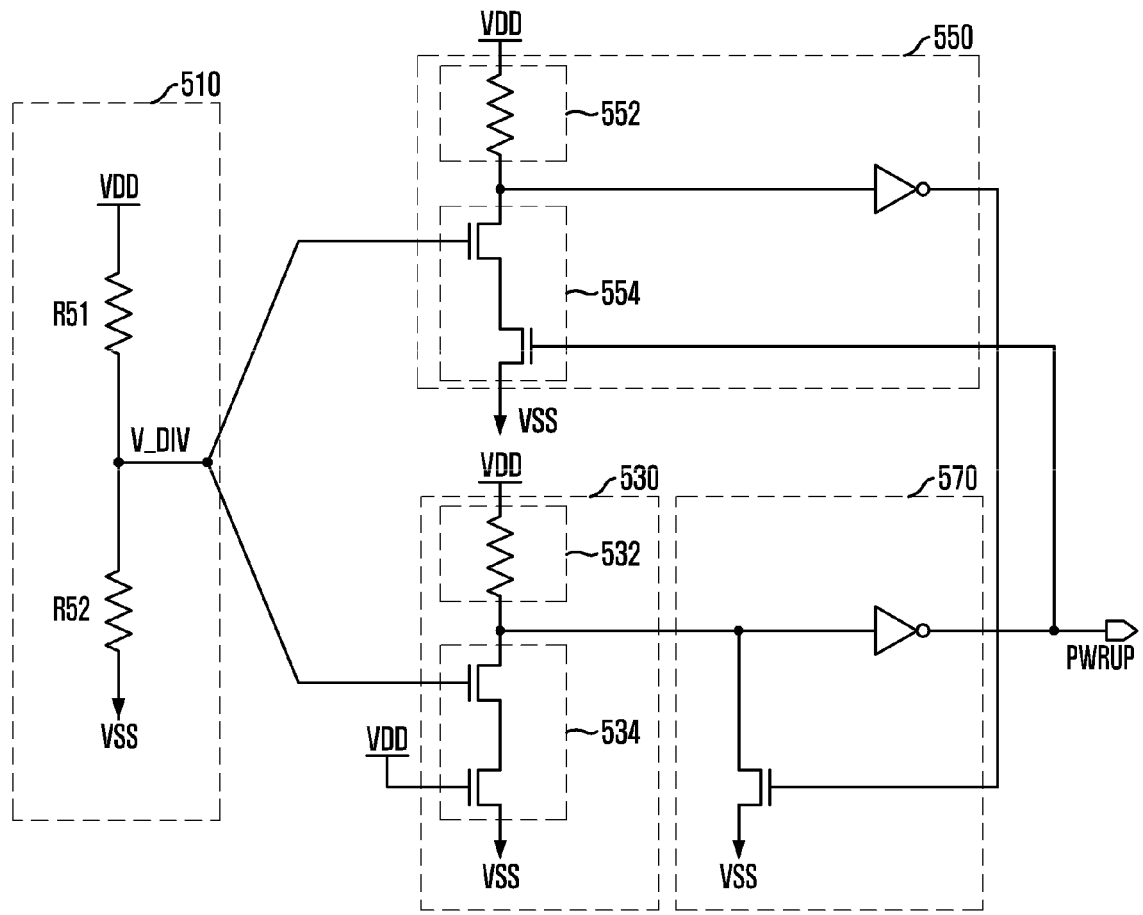
FIG. 5 is a circuit diagram of a power up signal generation circuit in accordance with another embodiment of the invention.

FIG. 5 is a circuit diagram of a power up signal generation circuit in accordance with another embodiment of the invention.

Referring to FIG. 5, the power up signal generation circuit may include a voltage division unit 510, a first voltage detection unit 530, a second voltage detection unit 550, and a power up signal drive unit 570. Because the operations of the elements are substantially the same as those of FIG. 3, detailed descriptions thereto will be omitted herein and only the voltage division unit 510, which has a different configuration from that of the voltage division unit 310 of FIG. 3 will be described herebelow.

The voltage division unit 510 is configured to divide an external power supply voltage to generate a divided voltage V_DIV. The voltage division unit 510 includes a first resistor R51 and a second resistor R52 serially connected between an external power supply voltage terminal VDD and a ground voltage terminal VSS. Here, the divided voltage V_DIV varies linearly with the external power supply voltage.

The first voltage detection unit 530 and the second voltage detection unit 550 receive the same divided voltage V_DIV to detect a first target voltage level and a second target voltage level having a predetermined voltage level difference. To this end, a first load 532 of the first voltage detection unit 530 and a second load 552 of the second voltage detection unit 550 preferably have different configurations from each other. Also, a first driver 534 of the first voltage detection unit 530 and a second driver 554 of the second voltage detection unit 550 preferably have different configurations from each other.

That is, when the first and second drivers 534 and 554 are designed to have the same physical configuration, the first and second loads 532 and 552 may be designed such that the second load 552 has a load value smaller that that of the first load 532, to allow the second voltage detection unit 550 to perform operations corresponding to the second target voltage level. Also, when the first and second loads 532 and 552 are designed to have the same physical configuration, active devices of the first and second drivers 534 and 554 may be designed to have different channel widths and lengths from each other, to allow the second voltage detection unit 550 to perform operations corresponding to the second target voltage level. For example, when the active device of the second driver 554 has a channel length shorter than, while having a channel width identical to, that of the active device of the first driver 534, the second driver 554 can perform operations corresponding to the second target voltage level. Here, the expression that an active device has a channel length shorter than the other means that the active device has an effective load value smaller than the other.

As described above, the power up signal generation circuit can transit the power up signal PWRUP at the first and second target voltage levels, respectively, according to the hysteresis characteristic. Therefore, although the external power supply voltage experiences a voltage drop during the operation of the semiconductor device, it is possible to prevent the power up signal PWRUP from unexpected reset, and it is also possible to secure stable operations of the internal circuits through a smooth reset operation during power off.

According to the exemplary embodiments, the power up signal generation circuit generates the stable power up signal, which is transited at a predetermined target voltage level. As such, it is possible to secure stable operations of internal circuits, and thus improve the reliability of the semiconductor device.

In addition, it is possible to obtain an improved power up signal that has a desired hysteresis characteristic, i.e., that is transited at a predetermined target voltage level.

While the invention has been described with respect to the specific embodiments, it will be apparent to those skilled in the art that various changes and modifications may be made without departing from the spirit and scope of the invention as defined in the following claims.

In addition, the positions and the kinds of the logic gates and the transistors described above may be varied according to the polarity of the input signal.

What is claimed is:

1. A power up signal generation circuit, comprising:
a first voltage detection unit configured to detect a first target voltage level of a power supply voltage to output a detection signal;
a second voltage detection unit configured to detect a second target voltage level of the power supply voltage in response to a power up signal to output a control signal, wherein the second target voltage level is lower than the first target voltage level, and the first and second target voltage levels are greater than a around voltage level; and
a power up signal drive unit configured to activate the power up signal in response to the detection signal and drive the power up signal in response to a voltage level of the control signal.

2. The power up signal generation circuit as recited in claim 1, wherein the power up signal drive unit includes:
an output unit configured to buffer the detection signal to output the power up signal; and
a controller configured to control deactivation of the power up signal in response to the control signal.

3. The power up signal generation circuit as recited in claim 2, wherein the controller keeps the power up signal following a predetermined voltage level until the second voltage detection unit detects the second target voltage level, by preventing deactivation of the detection signal, and transits the power up signal at the second target voltage level.

4. The power up signal generation circuit as recited in claim 2, wherein the controller keeps an input terminal of the output buffer at a predetermined voltage level in response to the control signal.

5. The power up signal generation circuit as recited in claim 4, wherein the controller includes a MOS transistor configured to form a current path between the input terminal of the output buffer and a ground voltage terminal in response to the control signal.

6. The power up signal generation circuit as recited in claim 1, wherein the second voltage detection unit includes:
a detector configured to detect the second target voltage level of the power supply voltage; and
a buffer configured to buffer an output signal of the detector.

7. The power up signal generation circuit as recited in claim 6, wherein the detector includes:
a load connected between a power supply voltage terminal and an output terminal; and
a driver connected between the output terminal and a ground voltage terminal to drive the output terminal in response to the power supply voltage and the power up signal.

8. The power up signal generation circuit as recited in claim 1, wherein the power up signal has a hysteresis characteristic with respect to the power supply voltage.

9. A power up signal generation circuit, comprising:
a voltage division unit configured to divide a power supply voltage;
a first voltage detection unit configured to detect a first target voltage level using an output voltage of the voltage division unit to output a detection signal;
a second voltage detection unit configured to detect the second target voltage level using the output voltage of the voltage division unit in response to a power up signal to output a control signal, wherein the second target voltage level is lower than the first target voltage level, and the first and second target voltage levels are greater than a ground voltage level; and
a power up signal drive unit configured to activate the power up signal in response to the detection signal and drive the power up signal in response to a voltage level of the control signal.

10. The power up signal generation circuit as recited in claim 9, wherein the voltage division unit generates a first divided voltage and a second divided voltage, and the first divided voltage is lower than the second divided voltage.

11. The power up signal generation circuit as recited in claim 10, wherein the first voltage detection unit includes:
a first load connected between a power supply voltage terminal and a first output terminal; and
a first driver connected between the first output terminal and a ground voltage terminal to drive the first output terminal in response to the first divided voltage.

12. The power up signal generation circuit as recited in claim 11, wherein the second voltage detection unit includes:
a detector configured to detect the second target voltage level using the second divided voltage; and
a buffer configured to buffer an output signal of the detector.

13. The power up signal generation circuit as recited in claim 12, wherein the detector includes:
a second load connected between the power supply voltage terminal and a second output terminal; and
a second driver connected between the second output terminal and the ground voltage terminal to drive the second output terminal in response to the second divided voltage and the power up signal.

14. The power up signal generation circuit as recited in claim 13, wherein the first load and the second load have the same load value.

15. The power up signal generation circuit as recited in claim 13, wherein the first driver and the second driver have the same effective load value.

16. The power up signal generation circuit as recited in claim 9, wherein the first voltage detection unit includes:
a first load connected between a power supply voltage terminal and a first output terminal; and
a first driver connected between the first output terminal and a ground voltage terminal to drive the first output terminal in response to a divided voltage output from the voltage division unit.

17. The power up signal generation circuit as recited in claim 16, wherein the second voltage detection unit includes:
a detector configured to detect the second target voltage level using the divided voltage; and
a buffer configured to buffer an output signal of the detector.

18. The power up signal generation circuit as recited in claim 17, wherein the detector includes:
a second load connected between the power supply voltage terminal and a second output terminal; and
a second driver connected between the second output terminal and the ground voltage terminal to drive the second output terminal in response to the divided voltage and the power up signal.

19. The power up signal generation circuit as recited in claim 18, wherein a load value of the second load is smaller than a load value of the first load.

20. The power up signal generation circuit as recited in claim 18, wherein an effective load value of the second driver is smaller than an effective load value of the first driver.

21. The power up signal generation circuit as recited in claim 16, wherein the first driver pull-down drives the first output terminal in response to the divided voltage.

22. The power up signal generation circuit as recited in claim 18, wherein the second driver pull-down drives the second output terminal in response to the divided voltage.

23. The power up signal generation circuit as recited in claim 18, wherein the second driver includes:
an input unit configured to receive the divided voltage; and
an activation unit configured to enable the input unit in response to the power up signal.

24. The power up signal generation circuit as recited in claim 9, wherein an operation time of the second voltage detection unit is determined by the power up signal.

25. The power up signal generation circuit as recited in claim 9, wherein the power up signal drive unit includes:
an output buffer configured to output the power up signal in response to the detection signal; and
a controller configured to control deactivation time of the power up signal in response to the control signal.

26. The power up signal generation circuit as recited in claim 25, wherein the controller maintains the power up signal at a predetermined voltage level until the power supply voltage reaches the second target voltage level by preventing deactivation of the detection signal.

27. The power up signal generation circuit as recited in claim 25, wherein the controller keeps an input terminal of the output buffer at a predetermined voltage level in response to the control signal.

28. The power up signal generation circuit as recited in claim 27, wherein the controller includes a MOS transistor configured to form a current path between the input terminal of the output buffer and a ground voltage terminal in response to the control signal.

29. The power up signal generation circuit as recited in claim 9, wherein the power up signal has a hysteresis characteristic with respect to the power supply voltage.

* * * * *